(12) United States Patent
Katoh et al.

(10) Patent No.: US 10,367,032 B2
(45) Date of Patent: Jul. 30, 2019

(54) LIGHT-EMITTING APPARATUS

(71) Applicants: CITIZEN ELECTRONICS CO., LTD., Fujiyoshida-shi, Yamanashi (JP); CITIZEN HOLDINGS CO., LTD., Tokyo (JP)

(72) Inventors: Tatsuya Katoh, Ebina (JP); Tadahiro Fukuda, Tokorozawa (JP)

(73) Assignees: CITIZEN ELECTRONICS CO., LTD., Yamanashi (JP); CITIZEN WATCH CO., LTD., Tokyo (JP)

( * ) Notice: Subject to any disclaimer, the term of this patent is extended or adjusted under 35 U.S.C. 154(b) by 792 days.

(21) Appl. No.: 14/985,592

(22) Filed: Dec. 31, 2015

(65) Prior Publication Data

US 2016/0223159 A1  Aug. 4, 2016

(30) Foreign Application Priority Data

Jan. 5, 2015 (JP) ................. 2015-000532

(51) Int. Cl.
*F21V 7/00* (2006.01)
*H01L 27/15* (2006.01)
(Continued)

(52) U.S. Cl.
CPC .......... *H01L 27/156* (2013.01); *H01L 33/504* (2013.01); *H01L 33/56* (2013.01);
(Continued)

(58) Field of Classification Search
CPC .... F21Y 2105/10; H01L 33/504; H01L 33/60; H01L 33/56
See application file for complete search history.

(56) References Cited

U.S. PATENT DOCUMENTS

2008/0067926 A1* 3/2008 Mizuno .................. C09K 11/06
313/504
2011/0050071 A1* 3/2011 Chung ...................... F21K 9/00
313/46
(Continued)

FOREIGN PATENT DOCUMENTS

JP          2012-004519 A      1/2012

*Primary Examiner* — Zheng Song
(74) *Attorney, Agent, or Firm* — RatnerPrestia

(57) ABSTRACT

A light-emitting apparatus having an LED-mounting surface having an improved light reflective efficiency is provided. The light-emitting apparatus includes a board, a first reflective layer arranged on the board, a second reflective layer different from the first reflective layer, arranged at a position different from the position of the first reflective layer on the board, a first configuration configured by a first LED element mounted on the first reflective layer and a first phosphor-containing resin which protects the first LED element and transforms a wavelength of light emitted from the first LED element, and a second configuration configured by a second LED element mounted on the second reflective layer and a second phosphor-containing resin which protects the second LED element and transforms a wavelength of light emitted from the second LED element. A reflective efficiency of the first reflective layer for first light emitted from the first configuration is higher than a reflective efficiency of the second reflective layer for the first light.

12 Claims, 12 Drawing Sheets

(51) Int. Cl.
  *H01L 33/60*    (2010.01)
  *H01L 33/50*    (2010.01)
  *H01L 33/56*    (2010.01)
  *F21Y 113/10*   (2016.01)
  *F21Y 113/17*   (2016.01)
  *F21Y 113/13*   (2016.01)

(52) U.S. Cl.
  CPC ............ *H01L 33/60* (2013.01); *F21V 7/0083* (2013.01); *F21Y 2113/10* (2016.08); *F21Y 2113/13* (2016.08); *F21Y 2113/17* (2016.08)

(56) References Cited

U.S. PATENT DOCUMENTS

| | | | |
|---|---|---|---|
| 2011/0215349 A1* | 9/2011 | An ........................ | H01L 33/486 257/89 |
| 2011/0278605 A1* | 11/2011 | Agatani .............. | H01L 25/0753 257/89 |
| 2011/0297974 A1* | 12/2011 | Takashima .............. | H01L 33/60 257/88 |
| 2014/0191655 A1* | 7/2014 | Kasakura ............ | H01L 25/0753 315/32 |
| 2015/0001566 A1* | 1/2015 | Barchmann .............. | H05K 1/02 257/98 |
| 2016/0149094 A1* | 5/2016 | Onuma ............... | H01L 25/0753 257/89 |
| 2017/0268734 A1* | 9/2017 | Kawaguchi ........ | H05B 33/0821 |

* cited by examiner

LIGHT-EMITTING APPARATUS

CROSS REFERENCE TO RELATED APPLICATION

This application is a new U.S. patent application that claims benefit of JP2015-000532, filed on Jan. 5, 2015. The entire contents of JP2015-000532 are hereby incorporated by reference.

TECHNICAL FIELD

The present invention relates to a light-emitting apparatus.

BACKGROUND

LEDs (light-emitting diodes) are semiconductor elements that are long life and have excellent drivability, and moreover are small in size, have good luminous efficiency, and a clear luminescent color. For these reasons, they have been widely used, for example, for illumination in recent years.

There is known a light-emitting apparatus having plural blue LEDs mounted on a board, the light-emitting section of which is divided into a first light-emitting section configured by blue LEDs together with a red phosphor and a second light-emitting section configured by blue LEDs together with a yellow phosphor (See, for example, Japanese Unexamined Patent Publication No. 2012-4519). In light-emitting apparatuses having LED elements sealed with a resin which contains phosphor, the LED-mounting surface serves as a reflective surface so that light emitted by the LEDs and by the phosphor is reflected in an irradiation direction of the apparatuses.

SUMMARY

The amount of light-emission from an LED the wavelength of which is transformed by phosphor and the wavelength and amount of light-emission from excited phosphor are different depending on the type and amount of the phosphor. Accordingly, when plural light-emitting sections having different light-emission behaviors from each other are mounted on a LED-mounting surface having a uniform configuration as a whole, a reflective efficiency of light of the LED-mounting surface may be lowered on some of the light-emitting sections.

In view of the above, an object of the present invention is to provide a light-emitting apparatus free from the above-described problem.

In addition, another object of the invention is to provide a light-emitting apparatus having an LED-mounting surface having an improved light reflective efficiency.

Provided is a light-emitting apparatus including a board, a first reflective layer arranged on the board, a second reflective layer different from the first reflective layer, arranged at a position different from the position of the first reflective layer on the board, a first configuration configured by a first LED element mounted on the first reflective layer and a first phosphor-containing resin which protects the first LED element and transforms a wavelength of light emitted from the first LED element, and a second configuration configured by a second LED element mounted on the second reflective layer and a second phosphor-containing resin which protects the second LED element and transforms a wavelength of light emitted from the second LED element, wherein a reflective efficiency of the first reflective layer for first light emitted from the first configuration is higher than a reflective efficiency of the second reflective layer for the first light.

Preferably, in the above light-emitting apparatus, a reflective efficiency of the second reflective layer for second light emitted from the second configuration is higher than a reflective efficiency of the first reflective layer for the second light.

Preferably, in the above light-emitting apparatus, the first LED element and the second LED element are the same type of elements, and the first phosphor-containing resin and the second phosphor-containing resin are different types of phosphor-containing resins.

Preferably, in the above light-emitting apparatus, the first LED element and the second LED element are different types of elements, and the first phosphor-containing resin and the second phosphor-containing resin are the same type of phosphor-containing resins.

Preferably, in the above light-emitting apparatus, the first LED element and the second LED element are different types of elements, and the first phosphor-containing resin and the second phosphor-containing resin are different types of phosphor-containing resins.

Preferably, in the above light-emitting apparatus, the first LED element, the first phosphor-containing resin, and the first reflective layer are arranged in one of two regions divided on the board, and the second LED element, the second phosphor-containing resin, and the second reflective layer are arranged in the other region.

Preferably, in the above light-emitting apparatus, the first LED element together with the first phosphor-containing resin and the first reflective layer, and the second LED element together with the second phosphor-containing resin and the second reflective layer are arranged respectively in a stripe manner on the board, with the stripes repeated alternatingly.

Preferably, in the above light-emitting apparatus, the first LED element, the first phosphor-containing resin, and the first reflective layer are arranged in a central section on the board, and the second LED element, the second phosphor-containing resin, and the second reflective layer are arranged in a peripheral section enclosing the central section on the board.

The above light-emitting apparatus has an LED-mounting surface having an improved light reflective efficiency.

BRIEF DESCRIPTION OF THE DRAWINGS

Other features and advantages of the present invention will be apparent from the ensuing description, taken in conjunction with the accompanying drawings, in which.

DESCRIPTION

Hereinafter, with reference to the drawings, a light-emitting apparatus will be described. It should be noted that the technical scope of the present invention is not limited to embodiments of the invention, but covers the invention described in the claims and its equivalent.

Figure 1A:
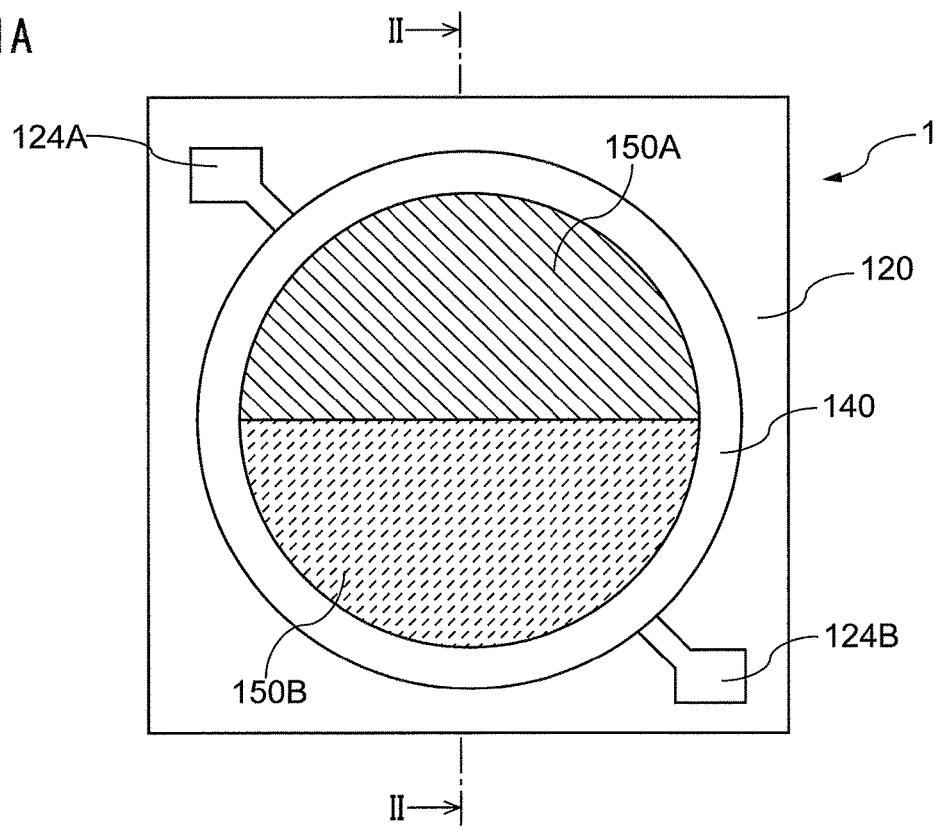
FIG. 1A is a plan view of a light-emitting apparatus 1.
Figure 1B:
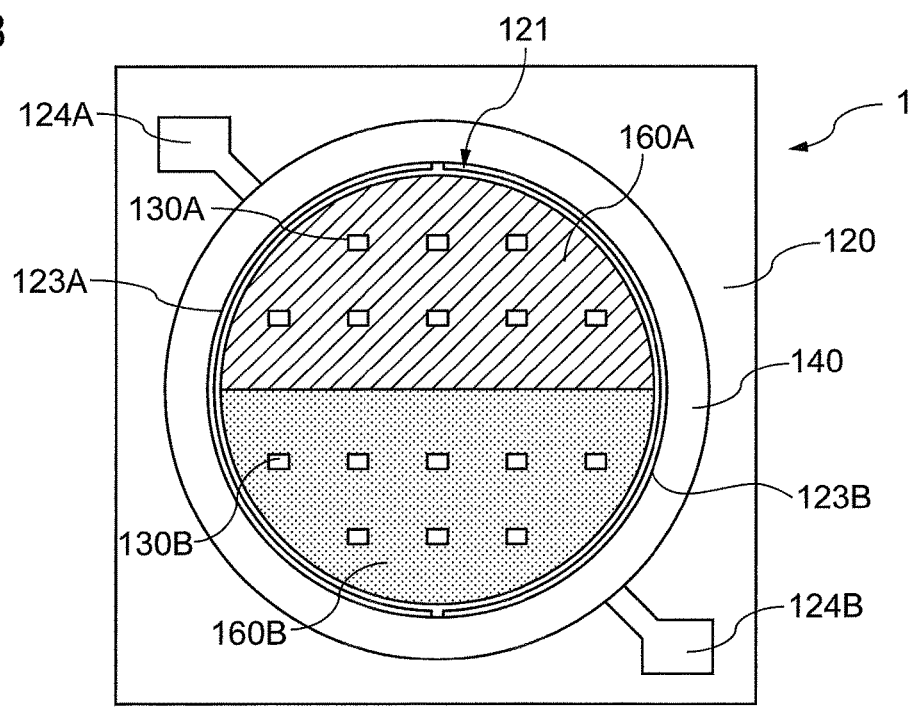
FIG. 1B is that of the light-emitting apparatus 1 seen through a first phosphor-containing resin 150A and a second phosphor-containing resin 150B.
Figure 2:
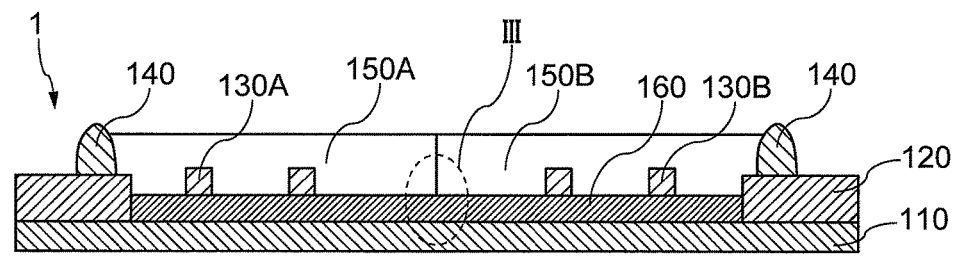
FIG. 2 is a cross-sectional view of the light-emitting apparatus 1 along the line II-II depicted in FIG. 1A.

FIG. 1A is a plan view of a light-emitting apparatus 1, and FIG. 1B is that of the light-emitting apparatus 1 seen through a first phosphor-containing resin 150A and a second phosphor-containing resin 150B. FIG. 2 is a cross-sectional view of the light-emitting apparatus 1 along the line II-II depicted in FIG. 1A.

The light-emitting apparatus 1 has a mount board 110, a circuit board 120, first LED elements 130A, second LED elements 130B, a reflector frame 140, a first phosphor-containing resin 150A, a second phosphor-containing resin 150B, a first reflective layer 160A, and a second reflective layer 160B as main elements. Hereinafter, the first LED elements 130A and the second LED elements 130B, the first phosphor-containing resin 150A and the second phosphor-containing resin 150B will also be referred to simply as "LED elements 130A, 130B" and "phosphor-containing resins 150A, 150B", respectively. In addition, the first reflective layer 160A and the second reflective layer 160B will be collectively referred to as a "reflective layer 160."

The mount board 110 is a board having a planar region on the upper surface of which the LED elements 130A, 130B are mounted, and is constituted by a metal member in order to enhance heat dissipativity. The mount board 110 is, for example, a metal board constituted by a support made of Al (aluminum) which exhibits excellent thermal resistance and heat dissipativity. The mount board 110 has a square shape as one example.

The circuit board 120 has, as one example, a square shape of the same size as that of the mount board 110 and is an insulating board having a circular opening 121 formed at the central region thereof. The lower surface of the circuit board 120 is bonded and fixed on the mount board 110 by using an adhesion sheet. On the upper surface of the circuit board 120, wiring patterns 123A, 123B are formed so as to enclose the opening 121. The wiring pattern 123A is electrically connected to a connection electrode 124A, and the wiring pattern 123B is electrically connected to a connection electrode 124B. One of the connection electrodes 124A, 124B is an anode electrode, and the other is a cathode electrode, both of which are connected to an external power supply in order to apply voltage thereto for light-emission of the light-emitting apparatus 1.

Each of the first LED elements 130A is a blue LED element for white light and is mounted, for example, by using a transparent insulating adhesive, on the first reflective layer 160A arranged on the mount board 110 exposed through the opening 121 of the circuit board 120. Each of the second LED elements 130B is a blue LED element for white light and is mounted, for example, by using a transparent insulating adhesive, on the second reflective layer 160B arranged on the mount board 110 exposed through the opening 121 of the circuit board 120. FIG. 1B depicts an example in which eight of the first LED elements 130A, and eight of the second LED elements 130B are mounted. A connection pattern connecting the LED elements 130A with each other and that connecting the LED elements 130B with each other will be described later. The luminescent color of the LED elements is not limited to blue, and LED elements having any luminescent color can be used.

The reflector frame 140 is a circular frame body made of white resin in such a way as to fit to the size of the opening 121 and is fixed at a position coincident with the wiring patterns 123A, 123B on the upper surface of the circuit board 120. The reflector frame 140 reflects light laterally emitted from the LED elements 130A, 130B and from a phosphor in the phosphor-containing resins 150A, 150B, in an upward direction in relation to the light-emitting apparatus 1 (direction opposite to the mount board 110 in relation to the LED elements 130A, 130B).

The first phosphor-containing resin 150A and the second phosphor-containing resin 150B are partitioned in such a way as to divide the opening 121 into two, by a roughly flat plane which is roughly perpendicular to the mount board 110 and roughly intersects the center of the opening 121. The first LED elements 130A, the first phosphor-containing resin 150A, and the first reflective layer 160A are arranged in one of the two semi-circular regions divided into two on the mount board 110 in opening 121, and the second LED elements 130B, the second phosphor-containing resin 150B, and the second reflective layer 160B are arranged on the other of the two semi-circular regions.

The first phosphor-containing resin 150A is a colorless and transparent resin such as epoxy resin or silicon resin, which covers and protects the first LED elements 130A. The first phosphor-containing resin 150A contains a phosphor such as, for example, YAG, which is excited by blue light from the first LED elements 130A, leading to emission of yellow light the wavelength of which is transformed from that of blue light. Then, the yellow and the blue lights from the first LED elements 130A are mixed to be white light having a color temperature of 5000 K.

The second phosphor-containing resin 150B is a colorless and transparent resin such as epoxy resin or silicon resin, which covers and protects the second LED elements 130B. The second phosphor-containing resin 150B contains phosphors such as, for example, YAG and CASN, which are excited by blue light from the second LED elements 130B, leading to emission of yellow light and red light, the wavelengths of which are transformed from that of the blue light. Then the yellow and the red lights, and the blue light from the second LED elements 130B are mixed to be white light having a color temperature of 2700 K. The above-described phosphors are one example and are not limited thereto.

Figure 3:
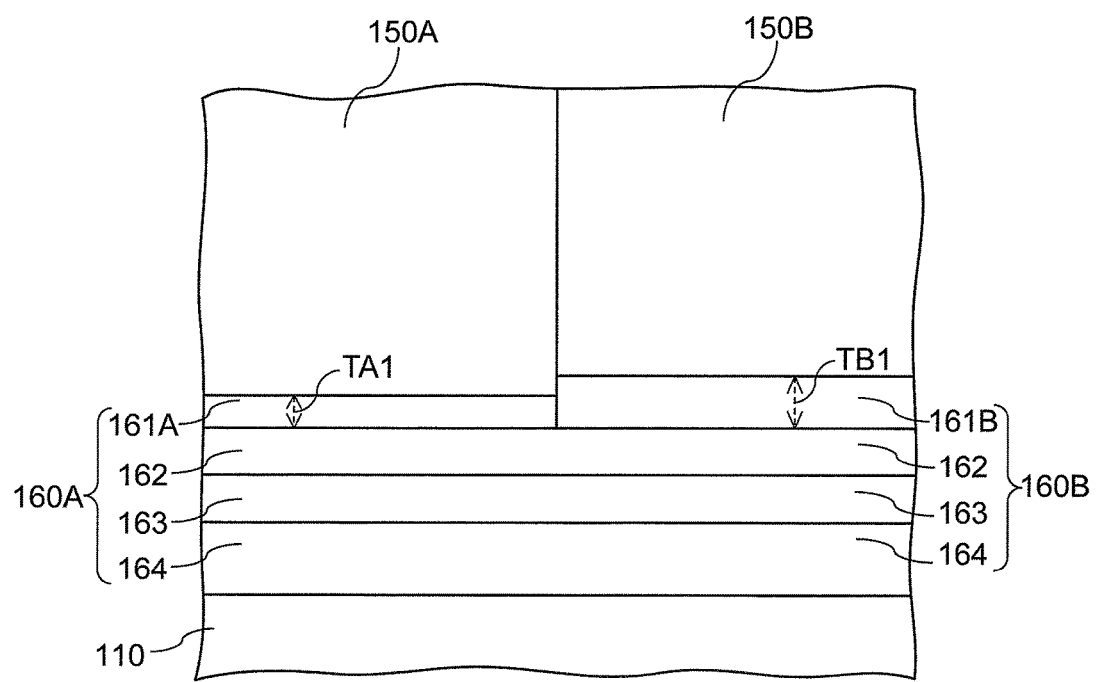
FIG. 3 is an enlarged view of the region III in FIG. 2.

FIG. 3 is an enlarged view of the region III in FIG. 2. As FIG. 3 schematically depicts positional relationships between respective elements, proportions between the respective elements are not necessarily correct.

The reflective layer 160 has $TiO_2$ (titanium dioxide) layers 161A, 161B, an $SiO_2$ (silicon dioxide) layer 162, an Al layer 163, and an alumite layer 164 in the mentioned order starting from the side thereof closest to the mounting surface of the LED elements 130A, 130B. As will be described later, the reflective layer 160 is partitioned into the first reflective layer 160A and the second reflective layer 160B, and the difference between the first reflective layer 160A and the second reflective layer 160B is only the thickness of the top-most $TiO_2$ layers 161A, 161B.

The $TiO_2$ layers 161A, 161B, and the $SiO_2$ layer 162 are thin films having refractive indices different from each other, and partially reflect incident light on respective boundary surfaces between these layers and other layers. In addition, the total intensity of all the reflected lights varies depending on wavelength due to interference between the lights reflected on the respective boundary surfaces, and the condition of the interference changes depending on the thickness of the $TiO_2$ layers 161A, 161B, and the $SiO_2$ layer 162. Thus, the $TiO_2$ layers 161A, 161B, and the $SiO_2$ layer 162 have a function supporting the light reflection function (reflection-enhancement function) of the Al layer 163 described later, and by controlling the thickness of these layers, the reflection-enhancement function can be changed in response to wavelength.

The $TiO_2$ layer 161A and the $TiO_2$ layer 161B are arranged under the first phosphor-containing resin 150A and the second phosphor-containing resin 150B, respectively. Although the $TiO_2$ layer 161A and the $TiO_2$ layer 161B are made of the same material, the thickness TA1 of the $TiO_2$ layer 161A is about 45 nm, and the thickness TB1 of the $TiO_2$ layer 161B is about 70 nm. In the region of the reflective layer 160, the region containing the $TiO_2$ layer 161A is defined as the first reflective layer 160A, and that containing the $TiO_2$ layer 161B is defined as the second reflective layer 160B. The thickness TA1 of the $TiO_2$ layer 161A and the thickness TB1 of the $TiO_2$ layer 161B are not limited to the above-mentioned thicknesses, and may be adjusted to any thickness so far as the light reflective efficiency of the LED-mounting surface can be improved.

The Al layer 163 is a layer containing Al as a light-reflecting material. The Al layer 163 functions as a reflective layer for reflecting, in an upward direction in relation to the light-emitting apparatus 1, light emitted toward the mount board 110 by the LED elements 130A, 130B and by the phosphors contained in the phosphor-containing resins 150A, 150B. The thickness of the Al layer 163 is, for example, 100 nm.

The alumite layer 164 has excellent chemical stability and a function to enhance, as an underlayer, the adhesivity of the Al layer 163 to the mount board 110. The thickness of the alumite layer 164 is, for example, from 0.5 to 2 µm.

Figure 4:
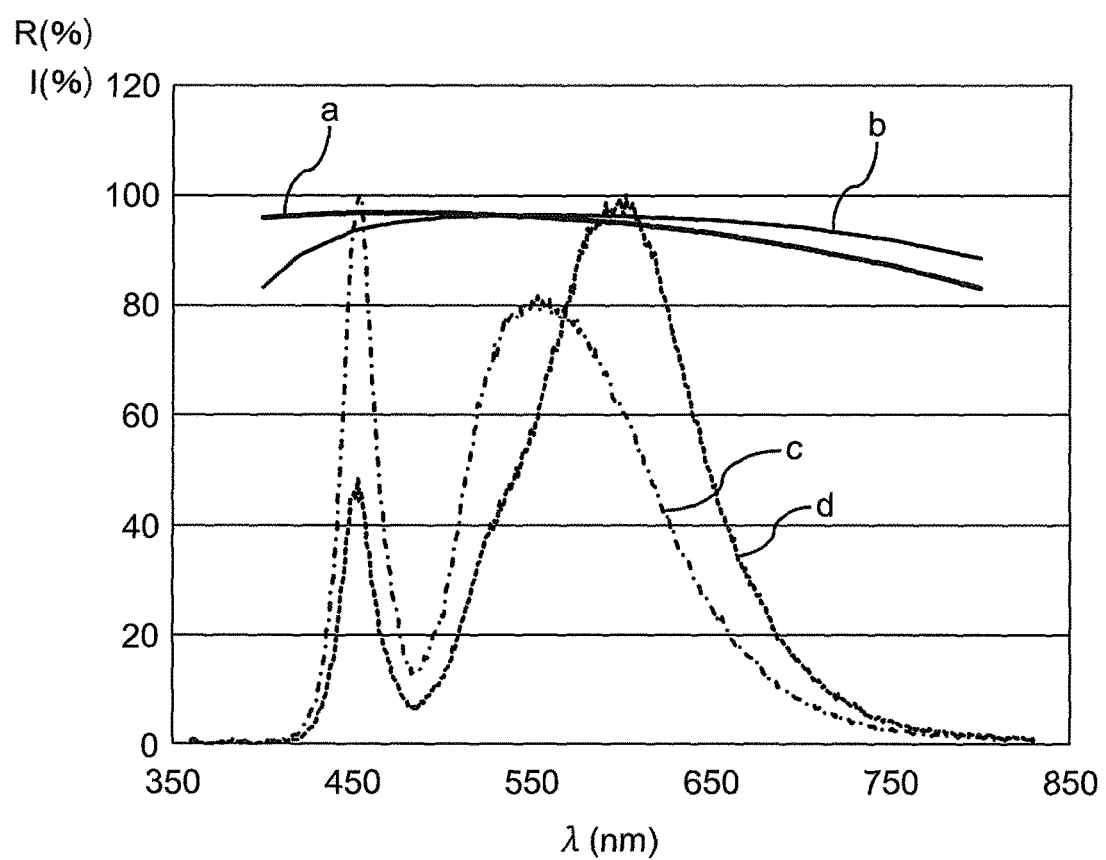
FIG. 4 is a graph for explaining the reflective efficiency of the light-emitting apparatus 1.

FIG. 4 is a graph for explaining the reflective efficiency of the light-emitting apparatus 1.

The curve a indicates the reflectance spectrum of the first reflective layer 160A, and the curve b indicates the reflectance spectrum of the second reflective layer 160B. The curve c indicates the light-emission spectrum of a first configuration (first light-emitting region, first light-emitting section) configured by the first LED elements 130A and the first phosphor-containing resin 150A, and the curve d indicates the light-emission spectrum of a second configuration (second light-emitting region, second light-emitting section) configured by the second LED elements 130B and the second phosphor-containing resin 150B. The horizontal axis of the graph is wavelength λ (nm), and the vertical axis is reflectance R (%), or relative luminescence intensity I (%).

As indicated by the curve a, the first reflective layer 160A has a reflectance of about 95% in the wavelength region of from 400 to 500 nm. With increase in wavelength from 500 nm, the reflectance gradually decreases down to about 85% near the wavelength of 800 nm.

In contrast, as indicated by the curve b, the second reflective layer 160B has a reflectance of about 85% near the wavelength of 400 nm. With increase in wavelength from 400 nm, the reflectance increases gradually up to about 95% near the wavelength of 550 nm. Then, with increase in wavelength from 550 nm, the reflectance decreases gradually down to about 90% near the wavelength of 800 nm.

The reflectance spectra thus behave differently between the first reflective layer 160A and the second reflective layer 160B, and the reason of this is that light wavelength regions in which high reflectance appears are different due to interference since the thickness of the $TiO_2$ layer 161A is different from that of the $TiO_2$ layer 161B.

For a light beam emitted from the first configuration configured by the first LED elements 130A and the first phosphor-containing resin 150A, the reflective efficiency of each of the first reflective layer 160A and the second reflective layer 160B was measured. As a result, the reflective efficiency of the second reflective layer 160B was 98.2% with respect to that of the first reflective layer 160A which was set to be 100.0%. Accordingly, for the light beam emitted from the first configuration, the first reflective layer 160A has a higher reflective efficiency than the second reflective layer 160B. In other words, for the light beam emitted from the first configuration, the $TiO_2$ layer which is the top-most layer of the reflective layer has a higher reflective efficiency when it is about 45 nm rather than about 70 nm in thickness.

Similarly, for a light beam emitted from the second configuration configured by the second LED elements 130B and the second phosphor-containing resin 150B, the reflective efficiency of each of the first reflective layer 160A and the second reflective layer 160B was measured. As a result, the reflective efficiency of the second reflective layer 160B was 100.7% with respect to that of the first reflective layer 160A which was set to be 100.0%. Accordingly, for the light beam emitted from the second configuration, the second reflective layer 160B has a higher reflective efficiency than the first reflective layer 160A. In other words, for the light beam emitted from the second configuration, the $TiO_2$ layer which is the top-most layer of the reflective layer has a higher reflective efficiency when it is about 70 nm rather than about 45 nm in thickness.

As described above, in the light-emitting apparatus 1, the first reflective layer having a higher reflective efficiency for the first configuration than the second reflective layer is arranged under the first configuration, and the second reflective layer having a higher reflective efficiency for the second configuration than the first reflective layer is arranged under the second configuration. Such a structure provides a light-emitting apparatus having an LED-mounting surface having an improved light reflective efficiency.

FIGS. 5A to 5D are figures for explaining a method of manufacturing the light-emitting apparatus 1.

Figure 5A:
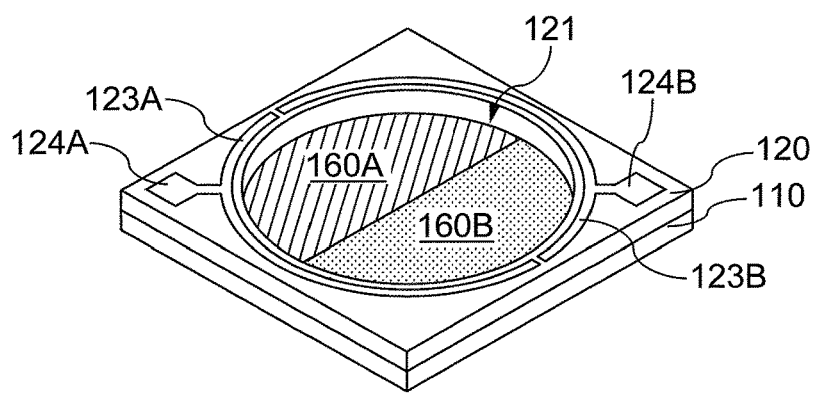
FIGS. 5A to 5D are figures for explaining a method of manufacturing the light-emitting apparatus 1.

As depicted in FIG. 5A, the circuit board 120 having wiring patterns provided thereon is attached on the mount board 110 by an adhesion sheet, and the reflective layer 160 is formed in the opening 121 on the mount board 110. The reflective layer 160 is formed by stacking sequentially the respective layers starting from the layer thereof closest to the mount board 110, by using sputtering, vapor deposition, or other various methods.

As for the TiO$_2$ layers 161A, 161B, the TiO$_2$ layer 161A, for example, may be first formed by keeping the TiO$_2$ layer 161B masked, and after removal of the masking, followed by forming the TiO$_2$ layer 161B, with the top of the TiO$_2$ layer 161A kept masked. Alternatively, whole of the TiO$_2$ layers 161A, 161B may be grown up to about 45 nm in thickness, followed by the growth of the TiO$_2$ layer 161B up to about 70 nm in thickness after masking only the TiO$_2$ layer 161A.

Figure 5B:
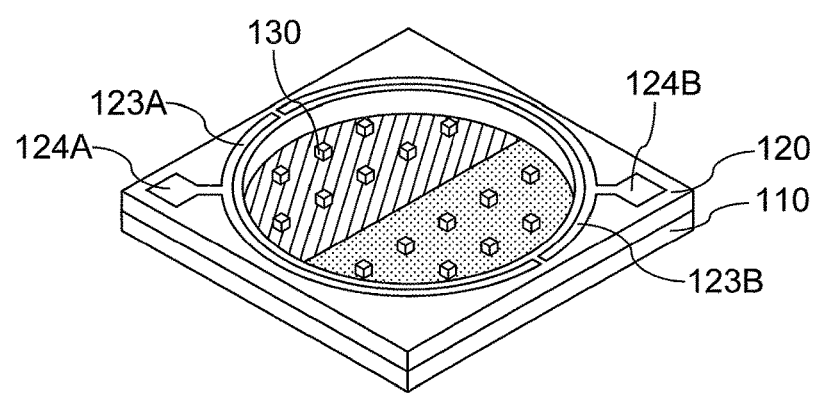
Figure 5C:
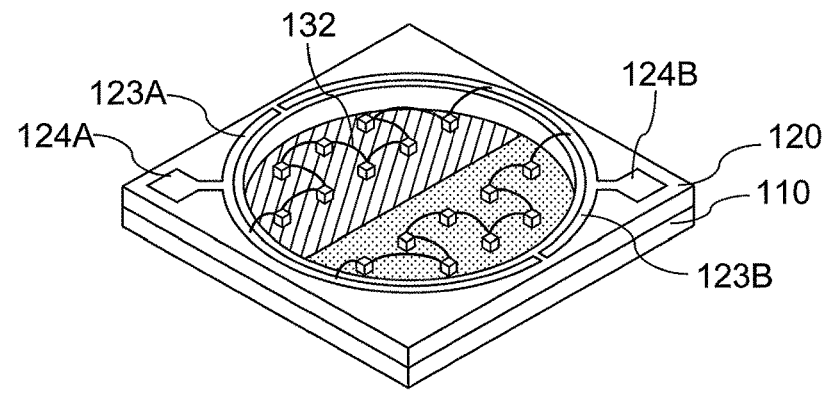

Then, as depicted in FIG. 5B, the first LED elements 130A and the second LED elements 130B are adhered to the upper surface of the first reflective layer 160A (upper surface of the TiO$_2$ layer 161A) and the upper surface of the second reflective layer 160B (upper surface of the TiO$_2$ layer 161B) by die bonding material, respectively. Next, as depicted in FIG. 5C, eight of the first LED elements 130A and eight of the second LED elements 130B are respectively connected in series by metal wire 132. Elements located at the both ends of the connected LED elements are connected to the wiring pattern 123A or the wiring pattern 123B by the metal wire 132. Accordingly, rows of the first LED elements 130A and the second LED elements 130B are connected in parallel between the wiring pattern 123A and the wiring pattern 123B.

Figure 5D:
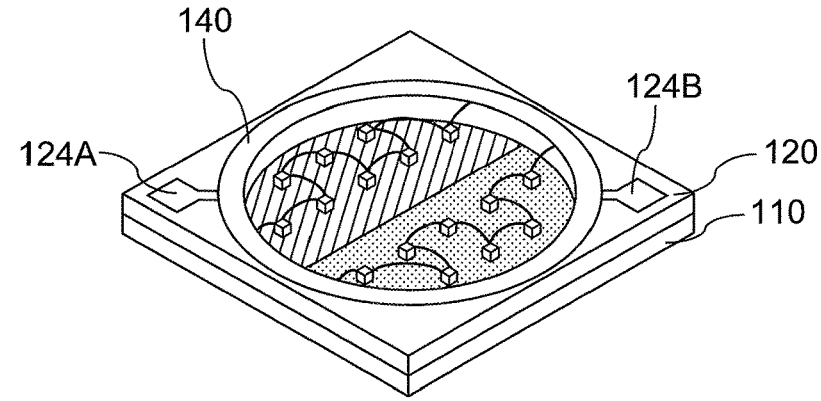

Then, as depicted in FIG. 5D, the reflector frame 140 is formed on the circuit board 120 in such a way as to cover the wiring patterns 123A, 123B. Next, a partition is placed on the boundary between the first reflective layer 160A and the second reflective layer 160B, and the first phosphor-containing resin 150A is formed on the top of the first reflective layer 160A so as to protect the first LED elements 130A (See FIG. 1A). Then, after removal of the partition, the second phosphor-containing resin 150B is formed on the top of the second reflective layer 160B so as to protect the second LED elements 130B (See FIG. 1A). Thus, the light-emitting apparatus 1 is provided.

Figure 6A:
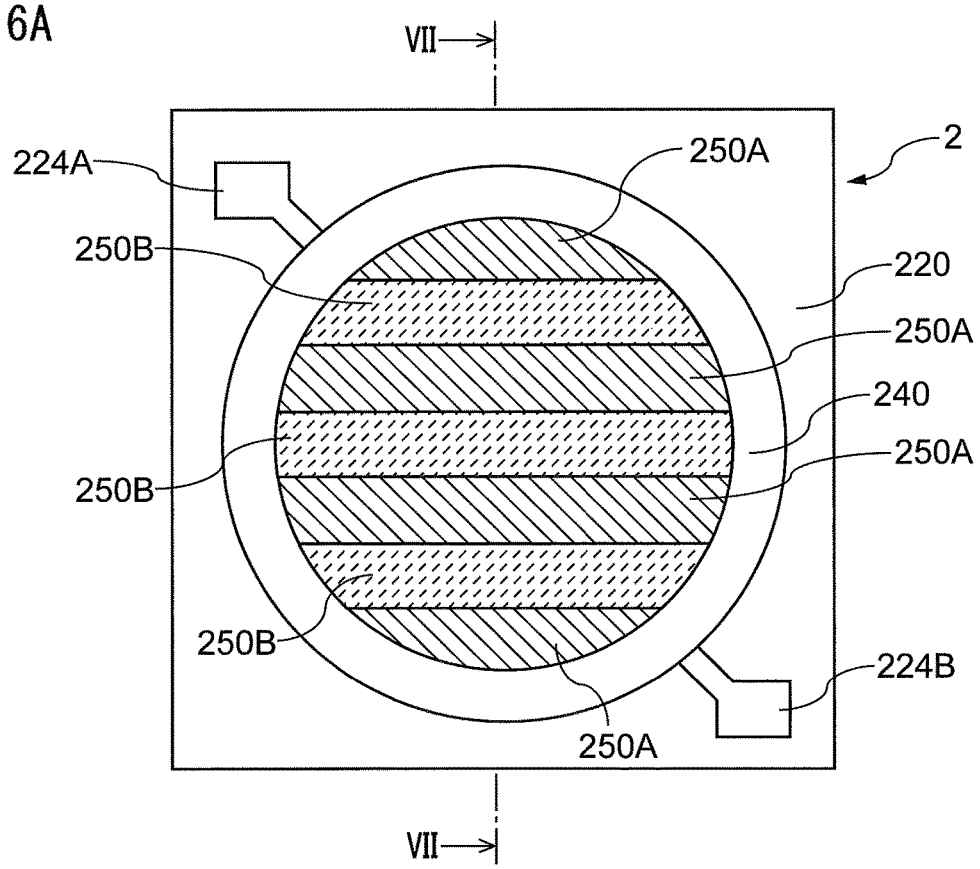
FIG. 6A is a plan view of another light-emitting apparatus 2.
Figure 6B:
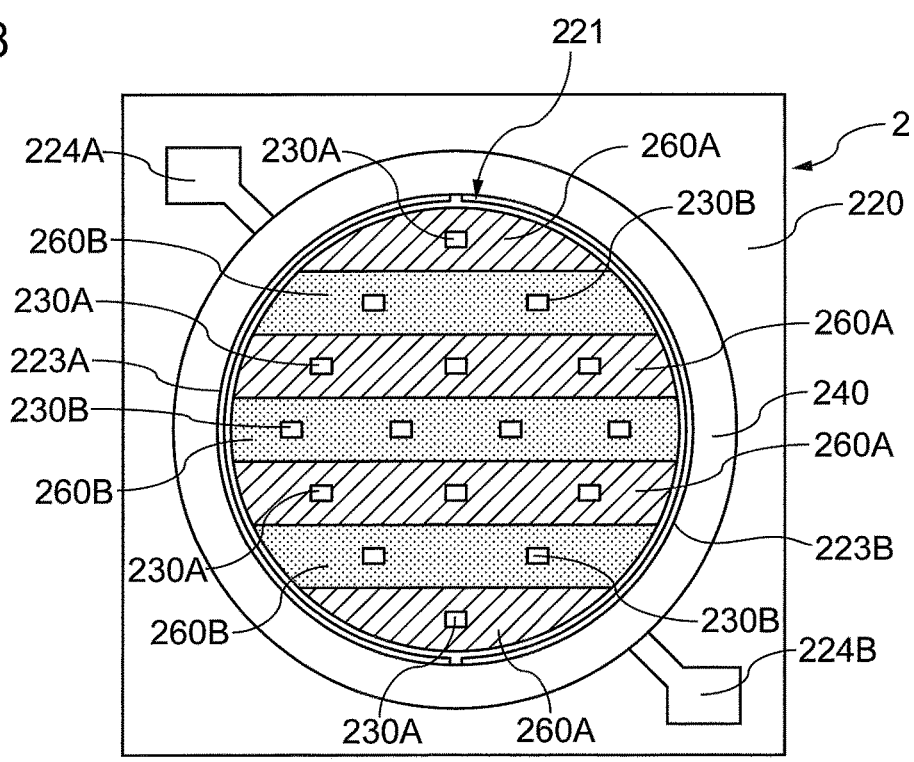
FIG. 6B is that of the light-emitting apparatus 2 seen through a first phosphor-containing resin 250A and a second phosphor-containing resin 250B.
Figure 7:
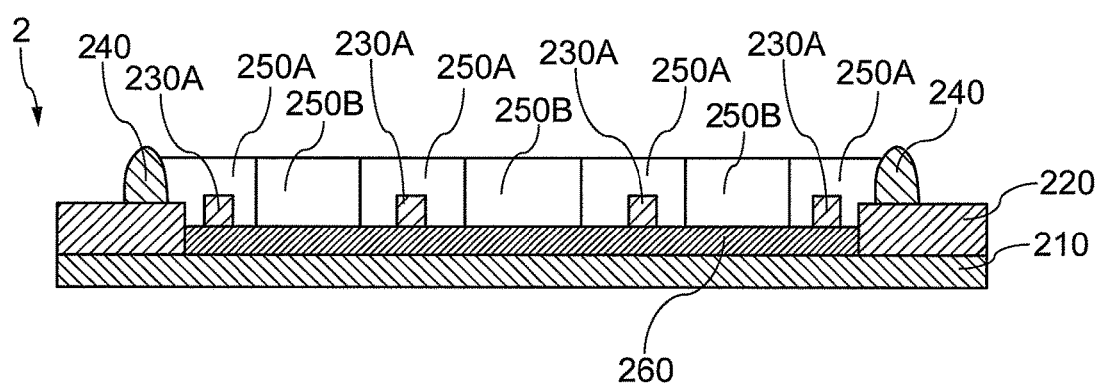
FIG. 7 is a cross-sectional view of the light-emitting apparatus 2 along the line VII-VII depicted in FIG. 6A.

FIG. 6A is a plan view of another light-emitting apparatus 2, and FIG. 6B is that of the light-emitting apparatus 2 seen through a first phosphor-containing resin 250A and a second phosphor-containing resin 250B. FIG. 7 is a cross-sectional view of the light-emitting apparatus 2 along the line VII-VII depicted in FIG. 6A.

The light-emitting apparatus 2 has a mount board 210, a circuit board 220, first LED elements 230A, second LED elements 230B, a reflector frame 240, a first phosphor-containing resin 250A, a second phosphor-containing resin 250B, a first reflective layer 260A, and a second reflective layer 260B as main elements. Symbols 223A, 223B represent the same wiring patterns as the wiring patterns 123A, 123B, and symbols 224A, 224B represent the same connection electrodes as the connection electrodes 124A, 124B. In FIG. 7, the first reflective layer 260A and the second reflective layer 260B are collectively represented by a symbol 260. Explanation will be hereinafter omitted for the same configurations of the light-emitting apparatus 2 as those of the light-emitting apparatus 1 accordingly.

As depicted in FIG. 6A, in the light-emitting apparatus 2, the first phosphor-containing resin 250A having the same composition as that of the first phosphor-containing resin 150A and the second phosphor-containing resin 250B having the same composition as that of the second phosphor-containing resin 150B are respectively formed in a stripe manner within an opening 221, with the stripes repeated alternatingly. In addition, as depicted in FIG. 6B, the first reflective layer 260A having the same layer configuration as that of the first reflective layer 160A is formed under the first phosphor-containing resin 250A, and the second reflective layer 260B having the same layer configuration as that of the second reflective layer 160B is formed under the second phosphor-containing resin 250B. In other words, in the light-emitting apparatus 2, the first LED elements 230A together with the first phosphor-containing resin 250A and the first reflective layer 260A, and the second LED elements 230B together with the second phosphor-containing resin 250B and the second reflective layer 260B are divided into respective plural stripe regions on the mount board 210 in the opening 221, and these regions are arranged alternatingly. The phosphor-containing resins can be arranged not only in the alternating-stripe manner, but also in any other arrangement such as, for example, a concentric or randomly patterned arrangement.

As described above, in the light-emitting apparatus 2, the first reflective layer having a higher reflective efficiency for the first configuration than the second reflective layer is arranged under the first configuration, and the second reflective layer having a higher reflective efficiency for the second configuration than the first reflective layer is arranged under the second configuration. The first configuration is configured by the first LED elements 230A and the first phosphor-containing resin 250A, and the second configuration is configured by the second LED elements 230B and the second phosphor-containing resin 250B. Such a structure provides a light-emitting apparatus having an LED-mounting surface having an improved light reflective efficiency.

In the light-emitting apparatuses 1, 2, the first LED elements 130A, 230A and the second LED elements 130B, 230B are the same type of elements (blue LED elements), and the first phosphor-containing resins 150A, 250A and the second phosphor-containing resins 150B, 250B are different types of phosphor-containing resins. However, so far as the light reflective efficiency of the LED-mounting surface can be improved, the first LED elements and the second LED elements may be different types of elements, and the first phosphor-containing resin and the second phosphor-containing resin may be the same type of phosphor-containing resins.

Figure 8A:
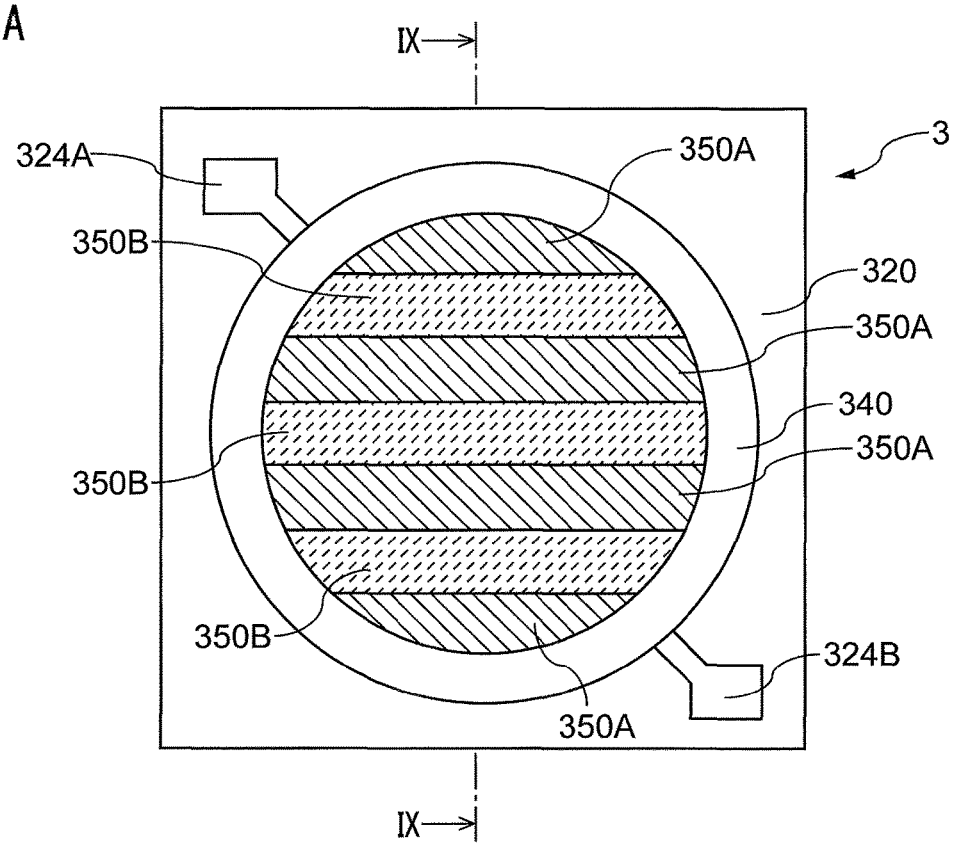
FIG. 8A is a plan view of still another light-emitting apparatus 3.
Figure 8B:
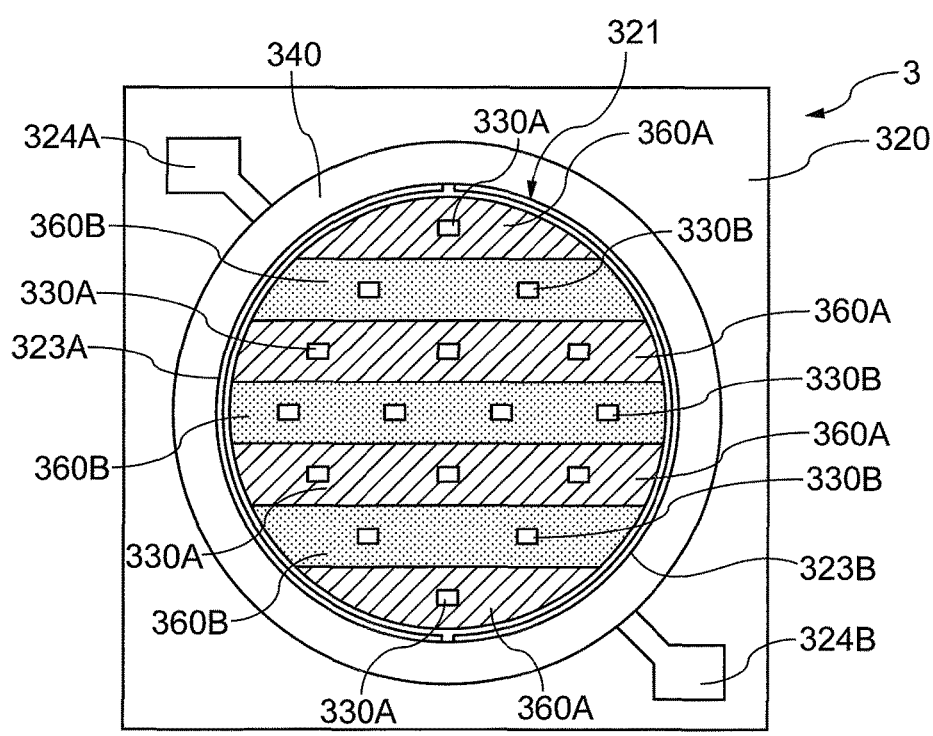
FIG. 8B is that of the light-emitting apparatus 3 seen through a first phosphor-containing resin 350A and a second phosphor-containing resin 350B.
Figure 9:
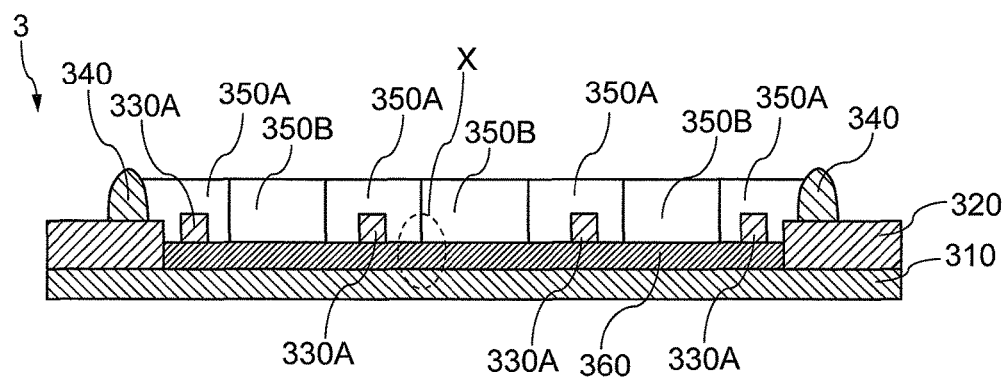
FIG. 9 is a cross-sectional view of the light-emitting apparatus 3 along the line IX-IX depicted in FIG. 8A.

FIG. 8A is a plan view of still another light-emitting apparatus 3, and FIG. 8B is that of the light-emitting apparatus 3 seen through a first phosphor-containing resin 350A and a second phosphor-containing resin 350B. In addition, FIG. 9 is a cross-sectional view of the light-emitting apparatus 3 along the line Ix-Ix depicted in FIG. 8A.

The light-emitting apparatus 3 has a mount board 310, a circuit board 320, first LED elements 330A, second LED elements 330B, a reflector frame 340, a first phosphor-containing resin 350A, a second phosphor-containing resin 350B, a first reflective layer 360A, and a second reflective layer 360B as main elements. Symbols 323A, 323B represent the same wiring patterns as the wiring patterns 123A, 123B, and symbols 324A, 324B represent the same connection electrodes as the connection electrodes 124A, 124B. The first LED elements 330A and the second LED elements 330B, the first phosphor-containing resin 350A and the second phosphor-containing resin 350B will be hereinafter also referred to simply as "LED elements 330A, 330B" and "phosphor-containing resins 350A, 350B", respectively. In addition, the first reflective layer 360A and the second reflective layer 360B are collectively referred to as a "reflective layer 360." Among the configurations of the light-emitting apparatus 3, explanation will be hereinafter omitted for the same configurations as those of the light-emitting apparatus 1 accordingly.

As depicted in FIG. 8A, the first phosphor-containing resin 350A and the second phosphor-containing resin 350B are respectively formed in a stripe manner in an opening 321, with the stripes repeated alternatingly. The first phosphor-containing resin 350A consists of a colorless and transparent resin such as epoxy resin or silicon resin, containing yellow, green, and red phosphors. On the other hand, the second phosphor-containing resin 350B consists of a colorless and transparent resin such as epoxy resin or silicon resin, containing blue, yellow, and red phosphors.

As depicted in FIG. 8B, the first reflective layer 360A is formed under the first phosphor-containing resin 350A, and the second reflective layer 360B is formed under the second phosphor-containing resin 350B. The first LED elements 330A protected by the first phosphor-containing resin 350A are arranged on the upper surface of the first reflective layer 360A, and the second LED elements 330B protected by the second phosphor-containing resin 350B are arranged on the upper surface of the second reflective layer 360B. In other word, in the light-emitting apparatus 3, the first LED elements 330A together with the first phosphor-containing resin 350A and the first reflective layer 360A, and the second LED elements 330B together with the second phosphor-containing resin 350B and the second reflective layer 360B are divided into respective plural stripe regions on the mount board 310 in the opening 321, and these regions are arranged alternatingly.

Each of the first LED elements 330A is an LED element emitting blue light. The yellow, the green, and the red phosphors contained in the first phosphor-containing resin 350A are excited by blue light from the first LED elements 330A, leading to emission of yellow light, green light, and red light, the wavelengths of which are respectively transformed from that of the blue light. Then, the yellow, the green, and the red lights are mixed with the blue light from the first LED elements 330A, resulting in white light.

Each of the second LED elements 330B is an LED element emitting violet light. The blue, the yellow, and the red phosphors contained in the second phosphor-containing resin 350B are excited by violet light from the second LED elements 330B, leading to emission of blue light, yellow light, and red light, the wavelengths of which are respectively transformed from that of the violet light. Then, the blue, the yellow, and the red lights are mixed with the violet light from the second LED elements 330B, resulting in white light.

Figure 10:
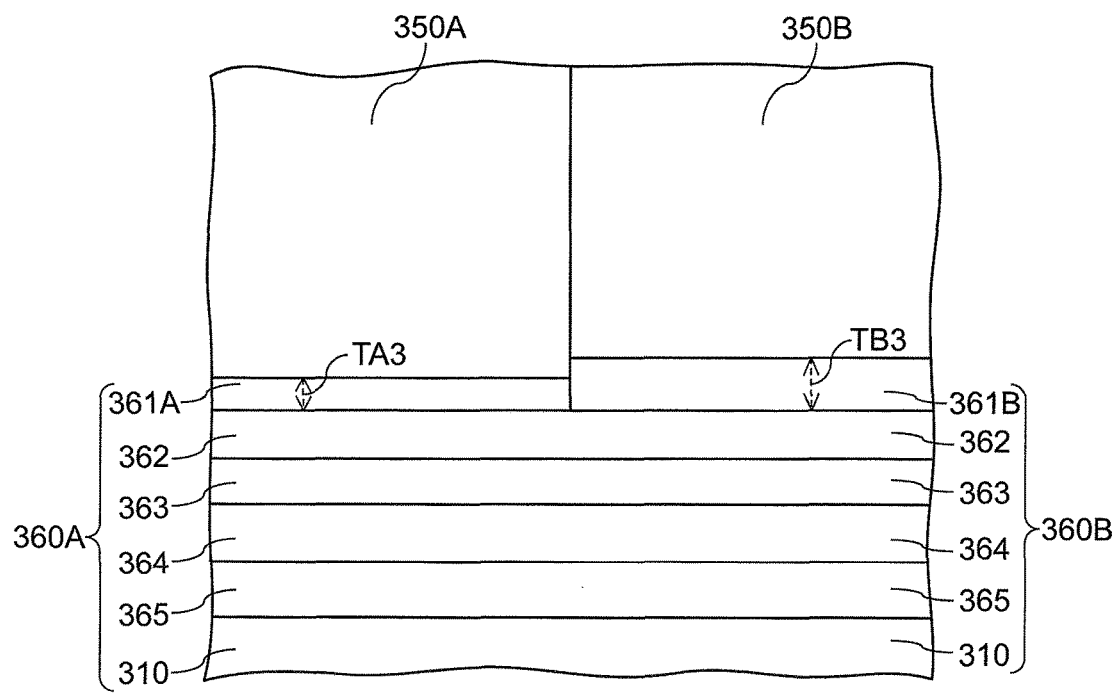
FIG. 10 is an enlarged view of the section X in FIG. 9.

FIG. 10 is an enlarged view of the section X in FIG. 9. As FIG. 10 schematically depicts positional relationships between respective elements, proportions between the respective elements are not necessarily correct.

The reflective layer 360 has $TiO_2$ layers 361A, 361B, a $SiO_2$ layer 362, an $Al_2O_3$ layer 363, an Ag (silver) layer 364, and an alumite layer 365 in the mentioned order starting from the side thereof closest to the mounting surface of the LED elements 330A, 330B. As will be described later, the reflective layer 360 is partitioned into the first reflective layer 360A and the second reflective layer 360B, and the difference between the first reflective layer 360A and the second reflective layer 360B is only the thickness of the top-most $TiO_2$ layers 361A, 361B.

The $TiO_2$ layers 361A, 361B and the $SiO_2$ layer 362 have, like the case of the light-emitting apparatus 1, a reflection-enhancement function supporting the light reflection function of the Ag layer 364 described later, and in addition, it is possible to change the reflection-enhancement function in response to wavelength by controlling their thickness.

The $TiO_2$ layer 361A is arranged under the first phosphor-containing resin 350A, and the $TiO_2$ layer 361B is arranged under the second phosphor-containing resin 350B. Although the $TiO_2$ layer 361A and the $TiO_2$ layer 361B are made of the same material, the thickness TA3 of the $TiO_2$ layer 361A is about 30 nm, and the thickness TB3 of the $TiO_2$ layer 361B is about 50 nm. In the region of the reflective layer 360, the region containing the $TiO_2$ layer 361A is defined as the first reflective layer 360A, and that containing the $TiO_2$ layer 361B is defined as the second reflective layer 360B.

The $Al_2O_3$ layer 363 is an intermediate layer to adhere the Ag layer 364 and the $SiO_2$ layer 362.

The Ag layer 364 is a layer containing silver as a light-reflecting material. The Ag layer 364 functions as a reflective layer to reflect, in an upward direction in relation to the light-emitting apparatus 3, light emitted toward the mount board 310 by LED elements 330A, 330B and by the phosphors contained in the phosphor-containing resins 350A, 350B. The thickness of the Ag layer 364 is, for example, about 100 nm.

The alumite layer 365 has excellent chemical stability and a function to enhance, as an underlayer, adhesivity of the Ag layer 364 to the mount board 310. The thickness of the alumite layer 365 is, for example, about from 0.5 to 2 µm.

Figure 11:
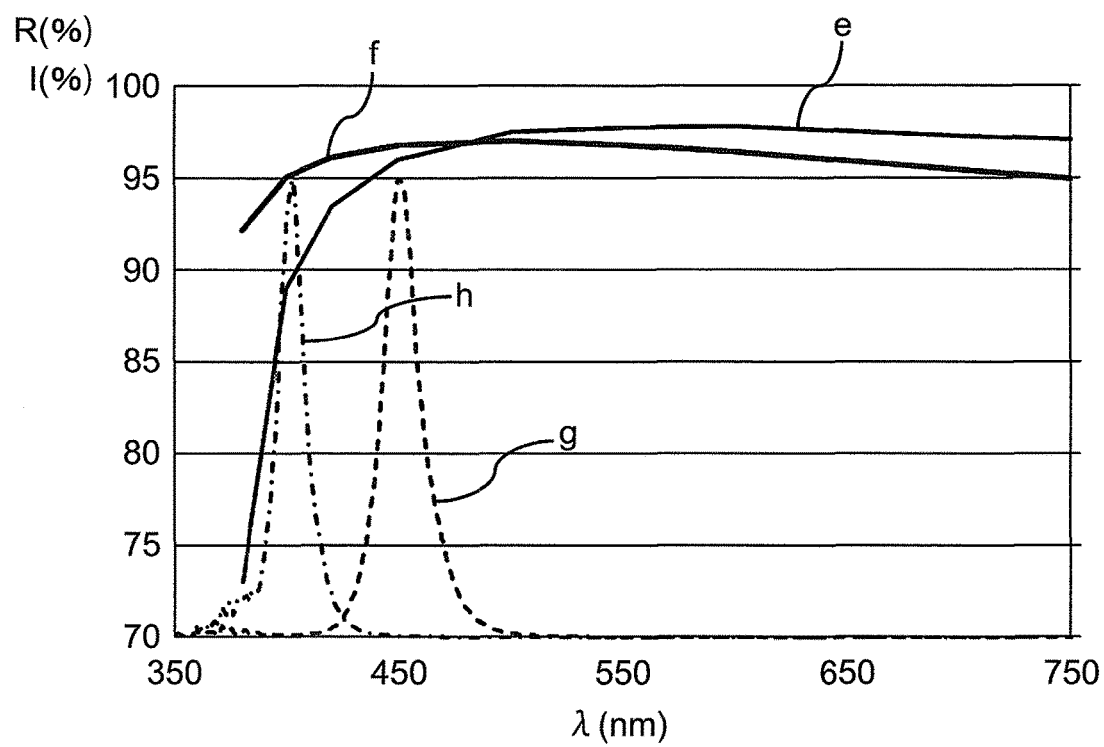
FIG. 11 is a graph for explaining the light reflective efficiency of the light-emitting apparatus 3.

FIG. 11 is a graph for explaining the light reflective efficiency of the light-emitting apparatus 3.

The curve e indicates the reflectance spectrum of the first reflective layer 360A, and the curve f indicates the reflectance spectrum of the second reflective layer 360B. The curve g indicates the light-emission spectrum of the first LED elements 330A, and the curve h indicates the light-emission spectrum of the second LED elements 330B. The horizontal axis of the graph is wavelength λ (nm), and the vertical axis is reflectance R (%) or relative luminescence intensity I (%).

As indicated by the curve e, the first reflective layer 360A has a reflectance of about 97% in the wavelength region of from 500 to 750 nm. With decrease in wavelength from 500 nm, the reflectance drastically decreases down to about 75% near the wavelength of 380 nm.

In contrast, as indicated by the curve f, the second reflective layer 360B has a reflectance of about 97% near the wavelength of 500 nm. With increase in wavelength from 500 nm, the reflectance slowly decreases down to about 95% near the wavelength of 750 nm. On the other hand, with decrease in wavelength from 500 nm, the reflectance gradually decreases down to about 93% near the wavelength of 380 nm.

The reflectance spectra thus behave differently between the first reflective layer 360A and the second reflective layer 360B, and the reason of this is that light wavelength regions in which high reflectance appears are different due to interference since the thickness of the $TiO_2$ layer 361A is different from that of the $TiO_2$ layer 361B.

Near the wavelength of 450 nm at which the light-emission spectrum of the first LED elements 330A appears, the difference of reflectance is not large between the first reflective layer 360A and the second reflective layer 360B. On the other hand, as described above, the phosphors contained in the first phosphor-containing resin 350A emit yellow light, green light, and red light, the wavelengths of which are within the range of from about 500 to 750 nm. In this wavelength region of from about 500 to 750 nm, the second reflective layer 360B exhibits a higher reflectance than the first reflective layer 360A, and the difference of reflectance between them is roughly larger than that near the wavelength of 450 nm.

Accordingly, for a light beam emitted from the first configuration configured by the first LED elements 330A and the first phosphor-containing resin 350A, the first reflective layer 360A has a higher reflective efficiency than the second reflective layer 360B. In other words, for the light beam emitted from the first configuration, the $TiO_2$ of about 30 nm in thickness which is the top-most layer of the reflective layer has a higher reflective efficiency than that of about 50 nm in thickness.

On the other hand, near the wavelength of 400 nm at which the light-emission spectrum of the second LED elements 330B appears, the difference between the reflectance of the first reflective layer 360A (about 89%) and that of the second reflective layer 360B (about 95%) is about 6%. On the other hand, as described above, the phosphors contained in the second phosphor-containing resin 350B emit blue light, yellow light, and red light, the wavelengths of which are within the range of from about 500 to 750 nm. In addition, in this wavelength region, the difference between the reflectance of the first reflective layer 360A (about 95%) and that of the second reflective layer 360B (about from 95 to 97%) is at most about 3%, which is smaller than the difference of reflectance near the wavelength of 400 nm.

Accordingly, for a light beam emitted from the second configuration configured by the second LED elements 330B and the second phosphor-containing resin 350B, the second reflective layer 360B has a higher reflective efficiency than the first reflective layer 360A. In other words, for the light beam emitted from the second configuration, the $TiO_2$ of about 50 nm in thickness which is the top-most layer of the reflective layer has a higher reflective efficiency than that of about 30 nm in thickness.

Thus, in the light-emitting apparatus 3, the reflective layer having a higher reflective efficiency for the first configuration than the second reflective layer is arranged under the first configuration, and the second reflective layer having a higher reflective efficiency for the second configuration higher than the first reflective layer is arranged under the second configuration. Such a structure provides a light-emitting apparatus having an LED-mounting surface having an improved light reflective efficiency.

Figure 12A:
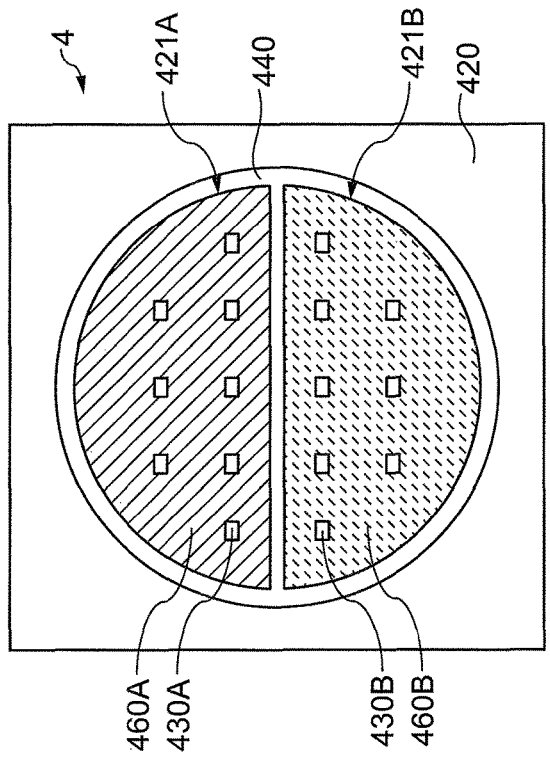
FIG. 12A is a plan view of still another light-emitting apparatus 4.
Figure 12B:
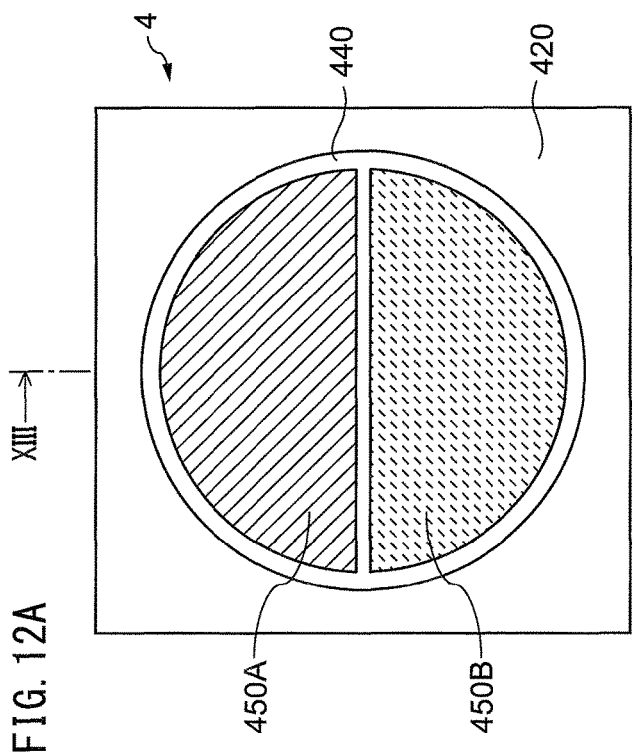
FIG. 12B is that of the light-emitting apparatus 4 seen through a first phosphor-containing resin 450A and a second phosphor-containing resin 450B.
Figure 13:
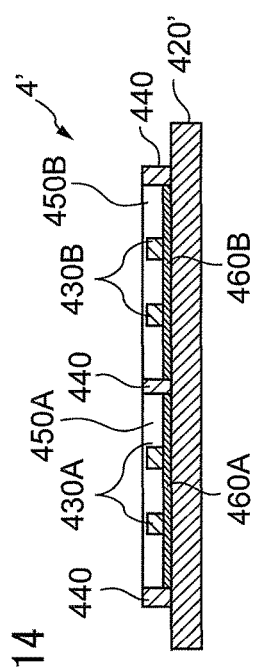
FIG. 13 is a cross-sectional view of the light-emitting apparatus 4 along the line XIII-XIII depicted in the FIG. 12A.

FIG. 12A is a plan view of still another light-emitting apparatus 4, and FIG. 12B is that of the light-emitting apparatus 4 seen through a first phosphor-containing resin 450A and a second phosphor-containing resin 450B. In addition, FIG. 13 is a cross-sectional view of the light-emitting apparatus 4 along the line XIII-XIII depicted in the FIG. 12A.

The light-emitting apparatus 4 has a mount board 410, a circuit board 420, first LED elements 430A, second LED elements 430B, a reflector frame 440, a first phosphor-containing resin 450A, a second phosphor-containing resin 450B, a first reflective layer 460A, and second reflective layer 460B as main elements. The light-emitting apparatus 4 has the same configurations as those of the light-emitting apparatus 1 with the exception of the shapes of the circuit board 420 and the reflector frame 440. Thus, explanation for the same configurations as those of the light-emitting apparatus 1 will be omitted.

The circuit board 420 has two semi-circular openings 421A, 421B which are circular as a whole, and has a linear wall section 422 between the openings 421A, 421B. The reflector frame 440 has a shape taken along the circumferences of the openings 421A, 421B and the straight lines of the wall section 422, and is fixed on the circuit board 420.

In the light-emitting apparatus 4, the first reflective layer 460A is formed on the mount board 410 exposed through the opening 421A, and the second reflective layer 460B is formed on the mount board 410 exposed through the opening 421B. The plural first LED elements 430A are mounted on the first reflective layer 460A, and the first phosphor-containing resin 450A is formed in such a way as to cover the first LED elements 430A in an integral fashion. On the other hand, the plural second LED elements 430B are mounted on the second reflective layer 460B, and the second phosphor-containing resin 450B is formed in such a way as to cover the second LED elements 430B in an integral fashion. In other words, the first LED elements 430A, the first phosphor-containing resin 450A, and the first reflective layer 460A are arranged in one of two semi-circular regions divided on the mount board 410, and the second LED elements 430B, the second phosphor-containing resin 450B, and the second reflective layer 460B are arranged in the other of the two semi-circular regions. In this manner, the first LED elements, the first phosphor-containing resin, and the first reflective layer may be separated by the reflector frame from the second LED elements, the second phosphor-containing resin, and the second reflective layer.

Figure 14:
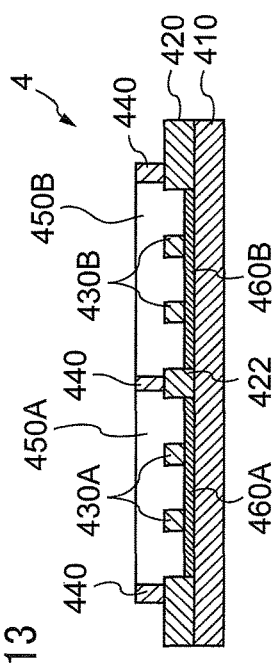
FIG. 14 is a cross-sectional view of still another light-emitting apparatus 4'.

FIG. 14 is a cross-sectional view of still another light-emitting apparatus 4'. FIG. 14 depicts the same cross-sectional view for the light-emitting apparatus 4' as in the case of the FIG. 13.

The light-emitting apparatus 4' has the same configurations as those of the light-emitting apparatus 4 with the exception of a difference from the light-emitting apparatus 4 in that the mount board 410 and the circuit board 420 of the light-emitting apparatus 4 are replaced with a ceramic board 420'. The ceramic board 420' is a flat board having wiring patterns, connection electrodes, a first reflective layer 460A, and a second reflective layer 460B which are formed on the upper surface thereof, and first LED elements 430A and second LED elements 430B which are mounted on the reflective layers, and the board serves as both of a mount board and a circuit board. In this manner, the board of the light-emitting apparatus may be configured by a single board with no opening. The plan view of the light-emitting apparatus 4' is the same as those depicted in the FIGS. 12A and 12B except that the symbol 420 is replaced with the symbol 420'.

Figure 15A:
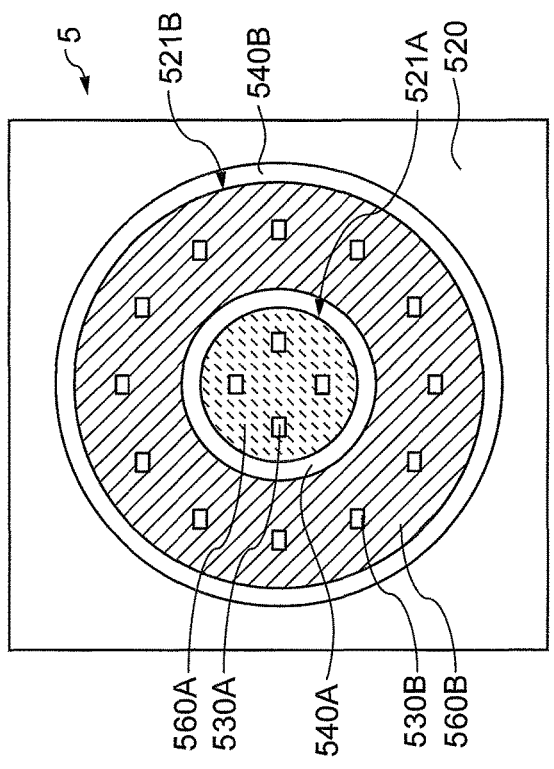
FIG. 15A is a plan view of still another light-emitting apparatus 5.
Figure 15B:
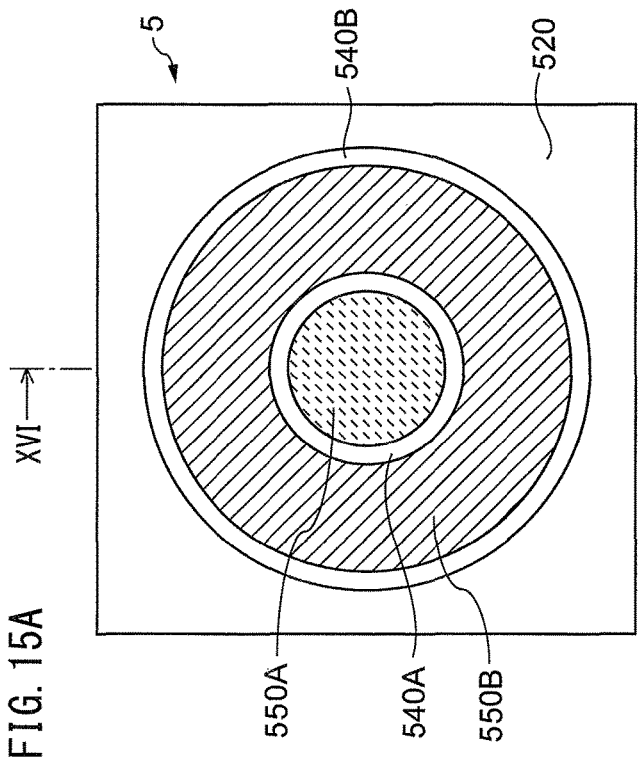
FIG. 15B is that of the light-emitting apparatus 5 seen through a first phosphor-containing resin 550A and a second phosphor-containing resin 550B.
Figure 16:
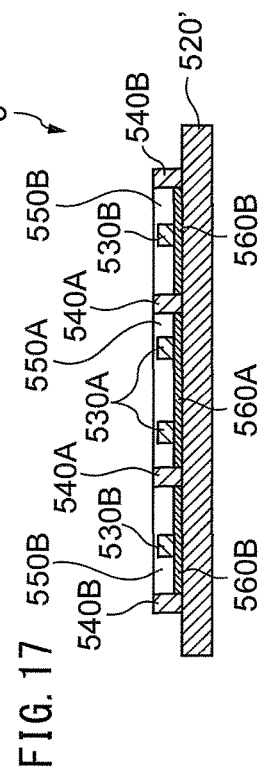
FIG. 16 is a cross-sectional view of the light-emitting apparatus 5 along the line XVI-XVI depicted in the FIG. 15A.

FIG. 15A is a plan view of still another light-emitting apparatus 5, and FIG. 15B is that of the light-emitting apparatus 5 seen through a first phosphor-containing resin 550A and a second phosphor-containing resin 550B. FIG. 16 is a cross-sectional view of the light-emitting apparatus 5 along the line XVI-XVI depicted in the FIG. 15A.

The light-emitting apparatus 5 has a mount board 510, a circuit board 520, first LED elements 530A, second LED elements 530B, reflector frames 540A, 540B, a first phosphor-containing resin 550A, a second phosphor-containing resin 550B, a first reflective layer 560A, and a second reflective layer 560B as main elements. The light-emitting apparatus 5 has the same configurations as those of the light-emitting apparatus 1 with the exception of the arrangement of the first LED elements 530A and the second LED elements 530B, and the shapes of the circuit board 520, the reflector frames 540A, 540B, the first phosphor-containing resin 550A, the second phosphor-containing resin 550B, the first reflective layer 560A, and the second reflective layer 560B. For this reason, explanation will be omitted for the same configurations as those of the light-emitting apparatus 1.

The circuit board 520 has a circular opening 521A and a ring-shaped opening 521B enclosing the opening 521A, and has a circular wall section 522 between the openings 521A, 521B. The reflector frames 540A, 540B are both circular frame bodies, and the reflector frame 540A is fixed on the wall section 522 in such a way as to enclose the opening 521A, and the reflector frame 540B is fixed near the edge of the opening 521B on the circuit board 520 in such a way as to enclose the opening 521B.

In the light-emitting apparatus 5, the first reflective layer 560A is formed on the mount board 510 exposed through the opening 521A, and the second reflective layer 560B is formed on the mount board 510 exposed through the opening 521B. The plural first LED elements 530A are mounted on the first reflective layer 560A, and the first phosphor-containing resin 550A is formed in such a way as to cover the first LED elements 530A in an integral fashion. On the other hand, the plural second LED elements 530B are mounted on the second reflective layer 560B, and the second phosphor-containing resin 550B is formed in such a way as to cover the second LED elements 530B in an integral fashion. In other words, the first LED elements 530A, the first phosphor-containing resin 550A and the first reflective layer 560A are arranged in the central section on the mount board 510, and the second LED elements 530B, the second phosphor-containing resin 550B, and the second reflective layer 560B are arranged in the peripheral section surrounding the central section on the mount board 510.

Figure 17:
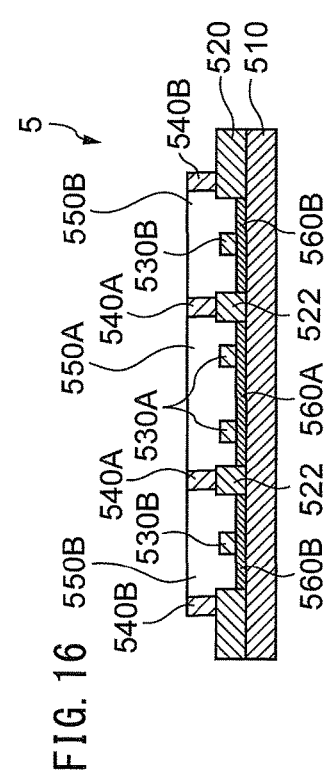
FIG. 17 is a cross-sectional view of still another light-emitting apparatus 5'.

FIG. 17 is a cross-sectional view of still another light-emitting apparatus 5'. FIG. 17 depicts the same cross-sectional view for the light-emitting apparatus 5' as in the case of the FIG. 16.

The light-emitting apparatus 5' has the same configurations as those of the light-emitting apparatus 5 with the exception of a difference from the light-emitting apparatus 5 in that the mount board 510 and the circuit board 520 of the light-emitting apparatus 5 are replaced with a ceramic board 520'. The ceramic board 520' is a flat board having wiring patterns, connection electrodes, a first reflective layer 560A, and a second reflective layer 560B which are formed on the upper surface thereof, and first LED elements 530A and second LED elements 530B which are mounted on the reflective layers. The plan view of the light-emitting apparatus 5' is the same as those depicted in the FIGS. 15A and 15B except that the symbol 520 is replaced with the symbol 520'.

Figure 18A:
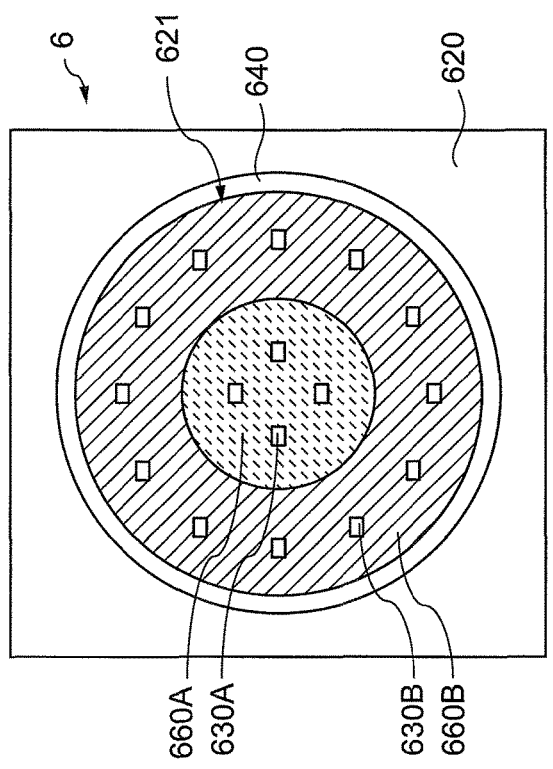
FIG. 18A is a plan view of still another light-emitting apparatus 6.
Figure 18B:
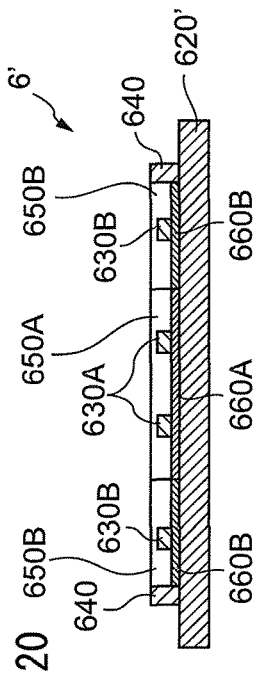
FIG. 18B is that of the light-emitting apparatus 6 seen through a first phosphor-containing resin 650A and a second phosphor-containing resin 650B.
Figure 19:
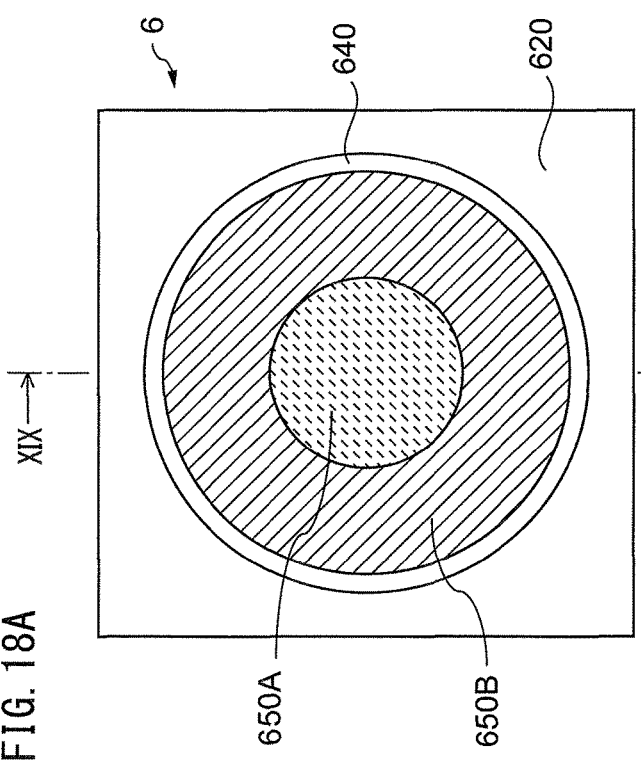
FIG. 19 is a cross-sectional view of the light-emitting apparatus 6 along the line XIX-XIX depicted in the FIG. 18A.

FIG. 18A is a plan view of still another light-emitting apparatus 6, and FIG. 18B is that of the light-emitting apparatus 6 seen through a first phosphor-containing resin 650A and a second phosphor-containing resin 650B. FIG. 19 is a cross-sectional view of the light-emitting apparatus 6 along the line XIX-XIX depicted in the FIG. 18A.

The light-emitting apparatus 6 has a mount board 610, a circuit board 620, first LED elements 630A, second LED elements 630B, a reflector frame 640, a first phosphor-containing resin 650A, a second phosphor-containing resin 650B, a first reflective layer 660A, and a second reflective layer 660B as main elements. The light-emitting apparatus 6 has the same configurations as those of the light-emitting apparatus 1 with the exception of the arrangement of the first LED elements 630A and the second LED elements 630B, and the shapes of the first phosphor-containing resin 650A, the second phosphor-containing resin 650B, the first reflective layer 660A, and the second reflective layer 660B. For this reason, explanation will be omitted for the same configurations as those of the light-emitting apparatus 1.

In the light-emitting apparatus 6, the circular first reflective layer 660A is formed in the central section on the mount board 610 exposed through a circular opening 621 of the circuit board 620, and the ring-shaped second reflective layer 660B is formed in the peripheral section in such a way as to enclose the first reflective layer 660A. The plural first LED elements 630A are mounted on the first reflective layer 660A, and the first phosphor-containing resin 650A is formed in such a way as to cover the first LED elements 630A in an integral fashion. On the other hand, the plural second LED elements 630B are mounted on the second reflective layer 660B, and the second phosphor-containing resin 650B is formed in such a way as to cover the second LED elements 630B in an integral fashion. In other words, the first LED elements 630A, the first phosphor-containing resin 650A and the first reflective layer 660A are arranged in the central section on the mount board 610, and the second LED elements 630B, the second phosphor-containing resin 650B, and the second reflective layer 660B are arranged in the peripheral section enclosing the central section on the mount board 610.

Figure 20:
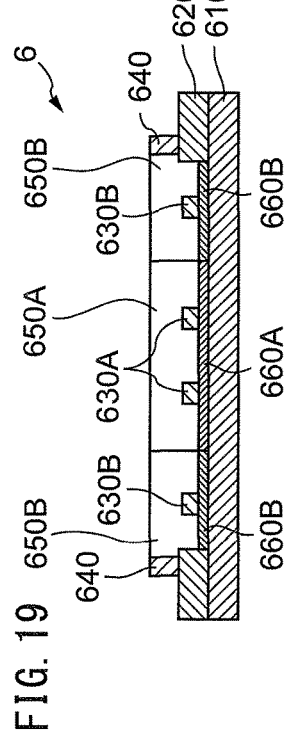
FIG. 20 is a cross-sectional view of still another light-emitting apparatus 6'.

FIG. 20 is a cross-sectional view of still another light-emitting apparatus 6'. FIG. 20 depicts the same cross-sectional view for the light-emitting apparatus 6' as in the case of the FIG. 19.

The light-emitting apparatus 6' has the same configurations as those of the light-emitting apparatus 6 with the exception of a difference from the light-emitting apparatus 6 in that the mount board 610 and the circuit board 620 of the light-emitting apparatus 6 are replaced with a ceramic board 620'. The ceramic board 620' is a flat board having wiring patterns, connection electrodes, a first reflective layer 660A, and a second reflective layer 660B which are formed on the upper surface thereof, and first LED elements 630A and second LED elements 630B which are mounted on the reflective layers. The plan view of the light-emitting apparatus 6' is the same as those depicted in the FIGS. 18A and 18B except that the symbol 620 is replaced with the symbol 620'.

In the light-emitting apparatuses 4, 4', 5, 5', 6, 6', the first LED elements 430A, 530A, 630A, and the first phosphor-containing resins 450A, 550A, 650A correspond to the first configuration, and the second LED elements 430B, 530B, 630B, and the second phosphor-containing resins 450B, 550B, 650B correspond to the second configuration. Also in these light-emitting apparatuses, the first reflective layer having a higher reflective efficiency for the first configuration than the second reflective layer is arranged under the first configuration, and the second reflective layer having a higher reflective efficiency for second configuration than the first reflective layer is arranged under the second configuration. Such a structure provides a light-emitting apparatus having an LED-mounting surface having an improved light reflective efficiency.

The preceding description has been presented only to illustrate and describe exemplary embodiments of the present invention. It is not intended to be exhaustive or to limit the invention to any precise form disclosed. It will be understood by those skilled in the art that various changes may be made and equivalents may be substituted for elements thereof without departing from the scope of the invention. In addition, many modifications may be made to adapt a particular situation or material to the teachings of the invention without departing from the essential scope. Therefore, it is intended that the invention not be limited to the particular embodiment disclosed as the best mode contemplated for carrying out this invention, but that the invention will include all embodiments falling within the scope of the claims. The invention may be practiced otherwise than is specifically explained and illustrated without departing from its spirit or scope.

What is claimed is:

1. A light-emitting apparatus comprising: a board; a first reflective layer arranged on the board; a second reflective layer different from the first reflective layer, arranged at a position different from the position of the first reflective layer on the board; a first configuration configured by a first LED element mounted on the first reflective layer and a first phosphor-containing resin which protects the first LED element and transforms a wavelength of light emitted from the first LED element; and a second configuration configured by a second LED element mounted on the second reflective layer and a second phosphor-containing resin which protects the second LED element and transforms a wavelength of light emitted from the second LED element, wherein a thickness of the first reflective layer is different than a thickness of the second reflective layer, and a reflective efficiency of the first reflective layer for first light emitted from the first configuration is higher than a reflective efficiency of the second reflective layer for the first light, wherein the first reflective layer includes a first light-reflecting metal layer and first reflection-enhancement layers deposited on the first light-reflecting metal layer, the first reflection-enhancement layers being composed of thin dielectric layers having refractive indices that are different from each other, the second reflective layer includes a second light-reflecting metal layer and second reflection-enhancement layers deposited on the second light-reflecting metal layer, the second reflection-enhancement layers being composed of thin dielectric layers having refractive indices that are different from each other, and the first reflection-enhancement layers and the second reflection-enhancement layers have different thicknesses.

2. The light-emitting apparatus according to claim 1, wherein a reflective efficiency of the second reflective layer for second light emitted from the second configuration is higher than a reflective efficiency of the first reflective layer for the second light.

3. The light-emitting apparatus according to claim 1, wherein the first LED element and the second LED element are the same type of elements, and the first phosphor-containing resin and the second phosphor-containing resin are different types of phosphor-containing resins.

4. The light-emitting apparatus according to claim 1, wherein the first LED element and the second LED are different types of elements, and the first phosphor-containing resin and the second phosphor-containing resin are the same type of phosphor-containing resins.

5. The light-emitting apparatus according to claim 1, wherein the first LED element and the second LED element are different types of elements, and the first phosphor-containing resin and the second phosphor-containing resin are different types of phosphor-containing resins.

6. The light-emitting apparatus according to claim 1, wherein the first LED element, the first phosphor containing resin, and the first reflective layer are arranged in one of two regions divided on the board, and the second LED element, the second phosphor-containing resin, and the second reflective layer are arranged in the other region.

7. The light-emitting apparatus according to claim 1, wherein the first LED element together with the first phosphor-containing resin and the first reflective layer, and the second LED element together with the second phosphor-containing resin and the second reflective layer are arranged respectively in a stripe manner on the board, with the stripes repeated alternatingly.

8. The light-emitting apparatus according to claim 1, wherein the first LED element, the first phosphor-containing resin, and the first reflective layer are arranged in a central section on the board, and the second LED element, the second phosphor-containing resin, and the second reflective layer are arranged in a peripheral section enclosing the central section on the board.

9. The light-emitting apparatus of claim 1, wherein a first top-most layer which is the top-most layer of the first reflection-enhancement layers and a second top-most layer which is the top-most layer of the second reflection-enhancement layers have different thicknesses.

10. The light-emitting apparatus according to claim 9, wherein
the first reflection-enhancement layers include a titanium dioxide layer and a silicon dioxide layer,
the second reflection-enhancement layers include a titanium dioxide layer and a silicon dioxide layer, and
the first top-most layer and the second top-most layer are titanium dioxide layers.

11. The light-emitting apparatus according to claim 10, wherein
the first LED element and the second LED element emit blue light,
the first phosphor-containing resin contains a yellow phosphor excited by the blue light to emit yellow light,
the second phosphor-containing resin contains a yellow phosphor and a red phosphor excited by the blue light to emit yellow light and red light, respectively, and
the second top-most layer is thicker than the first top-most layer.

12. The light-emitting apparatus according to claim 10, wherein
the first LED element emits blue light,
the second LED element emits violet light,
the first phosphor-containing resin contains a yellow phosphor, a green phosphor and a red phosphor excited by the blue light to emit yellow light, green light and red light, respectively,
the second phosphor-containing resin contains a blue phosphor, a yellow phosphor and a red phosphor excited by the violet light to emit blue light, yellow light and red light, respectively, and
the second top-most layer is thicker than the first top-most layer.

* * * * *